United States Patent [19]
Orbach et al.

[11] Patent Number: 5,111,273
[45] Date of Patent: * May 5, 1992

[54] FABRICATION OF PERSONALIZABLE INTEGRATED CIRCUITS

[75] Inventors: Zvi Orbach; Meir I. Janai, both of Haifa, Israel

[73] Assignee: Quick Technologies Ltd., Haifa, Israel

[*] Notice: The portion of the term of this patent subsequent to May 8, 2007 has been disclaimed.

[21] Appl. No.: 540,343

[22] Filed: Jun. 19, 1990

Related U.S. Application Data

[63] Continuation-in-part of Ser. No. 500,502, Mar. 28, 1990, which is a continuation of Ser. No. 311,397, Feb. 16, 1989, abandoned, which is a continuation of Ser. No. 273,706, Nov. 15, 1988, abandoned, which is a continuation of Ser. No. 819,707, Jan. 17, 1986, abandoned, and a continuation-in-part of Ser. No. 437,333, Nov. 20, 1989, which is a continuation of Ser. No. 117,943, Nov. 6, 1987, abandoned.

[51] Int. Cl.$^5$ .................. H01L 27/02; H01L 27/10
[52] U.S. Cl. .................................... 357/51; 357/40; 357/45
[58] Field of Search .................. 357/51, 40, 42, 45

[56] References Cited

U.S. PATENT DOCUMENTS

| | | | |
|---|---|---|---|
| 4,875,971 | 10/1989 | Orbach et al. | 357/31 |
| 4,924,287 | 5/1990 | Orbach | 357/51 |

Primary Examiner—J. Carroll
Attorney, Agent, or Firm—Ladas & Parry

[57] ABSTRACT

An integrated circuit which is readily customized by the user to his specific requirements and is thus suitable for prototype and small scale production.

11 Claims, 11 Drawing Sheets

FABRICATION OF PERSONALIZABLE INTEGRATED CIRCUITS

CROSS REFERENCE TO RELATED APPLICATIONS

This is a continuation-in-part of U. S. patent application Ser. No. 07/500,502 filed Mar. 28, 1990, which is a continuation of U. S. patent application Ser. No. 07/311,397, filed Feb. 16, 1989, which is a continuation of U. S. patent application Ser. No. 07/273,706 filed Nov. 15, 1988, which is a continuation of U. S. patent application Ser. No. 06/819,707 filed Jan. 17, 1986, the last three now being abandoned, and a continuation-in-part of U. S. patent application Ser. No. 07/437,333 filed Nov. 20, 1989, which is a continuation of now-abandoned U. S. patent application Ser. No. 07/117,943 filed Nov. 16, 1987.

FIELD OF THE INVENTION

The present invention relates to fabrication of integrated circuits and more particularly to techniques associated with the fabrication of prototype integrated circuits which are user modifiable and to systems employing same.

BACKGROUND OF THE INVENTION

Integrated circuits are electronic circuits which normally include a very large number of semiconductor elements, such as transistors and diodes, as well as other electronic components in highly compact form on a silicon wafer. The basic principle underlying integrated circuits is that instead of building an electronic circuit out of discrete components such as transistors, diodes, resistors and capacitors, the entire circuit is fabricated on the same piece of silicon in the form of a number of superimposed layers of conducting, insulating and transistors forming materials. By arranging predetermined geometric shapes in each of these layers, a circuit having a required function is realized.

The process by which an integrated circuit is fabricated is long and complex and basically includes the following steps:

1. A polished silicon wafer is exposed to an appropriate material in a reactor in order to "grow" a uniform layer of the material on its surface.

2. After the wafer is removed from the reactor, it is coated with a thin film of resist material, which is dried and baked.

3. A mask for the appropriate layer is created, which defines the precise pattern required on the silicon surface.

4. This mask is exposed to intense radiation such as ultraviolet light or low energy X-rays. In areas wherein the mask is transparent to such radiation, the radiation passes into the resist and breaks down its molecular structure. The portions of the resist that are covered by opaque portions of the mask are not affected.

5. The resist is then developed by immersing the silicon wafer in a solvent which dissolves the resist only at the locations which were exposed to the radiation.

6. The wafer is then exposed to an appropriate etching material which is effective to remove the material grown previously thereon (Step 1), except where the material is covered by resist, thus defining a desired pattern of the grown material.

7. The remaining resist material is then removed.

The above process is repeated for each of the layers of material forming the integrated circuit. In most integrated circuit technology one or more layers of metal are employed for internal connections on the integrated circuit. These metal layers are usually formed last.

As can be readily appreciated, the above process requires sophisticated machinery and custom masks which must be specially set up for each specific type of custom integrated circuit to be fabricated. For the process to be at all economical, extremely large quantities of integrated circuits must be produced for a given set up. Since there exist applications wherein the quantities desired of a specific circuit are not extremely large, techniques have been developed for producing integrated circuits known as gate arrays. In these gate arrays, a large amount of transistors and other components are produced by the above-described mass production techniques. Specific interconnections therebetween suitable for a specific circuit are then formed on the chip by etching a suitable metal layer thereon. Normally a protective insulative layer, such as $SiO_2$ is formed over the metal layer for mechanical protection as well as electrical insulation.

Despite the use of sophisticated computer aided design and semi-custom devices, the widespread use of dedicated non-standard integrated circuits is still limited because of the high costs and long lead time involved in their fabrication. Many users of integrated circuits still make extensive use of standard, "off the shelf" available small scale and medium scale integrated circuits.

Electronic circuits manufactured by combining a large number of such standard integrated circuits have a number of disadvantages:

a. A large number of printed circuit boards are required, resulting in an expensive product, relatively long assembly time, relative difficulty in maintenance and troubleshooting and large size.

b. Lower electrical power efficiency is realized. As a result, relatively large power sources are required and heavier and larger products result.

There are known integrated circuits such as EM-PROMS and PALS (programmable array logic) which are programmed by fusing which is accomplished electrically via the integrated circuit's input/output pins, requiring elaborate extra fusing circuitry for this purpose.

There are also known techniques for increasing yield of integrated circuits by excising inoperative portions thereof by fusing. This is normally done on wafers including a multiplicity of integrated circuits.

SUMMARY OF THE INVENTION

The present invention seeks to provided an integrated circuit which is readily customized by the user to his specific requirements and is thus suitable for prototype and small scale production.

The present invention also seeks to provide a technique for fabrication of prototype integrated circuits from finished integrated circuit blanks.

There is thus provided in accordance with a preferred embodiment of the present invention a gate array device including a collection of semiconductor elements, fusible links interconnecting the collection of semiconductor elements into an inoperably connected gate array device, and an insulation layer disposed over the collection of semiconductor elements and having discrete apertures overlying the fusible links, the collection of semiconductor elements being interconnected for converting the inoperable gate array device into a selected operable electronic function upon the fusing of predetermined ones of the fusible links.

Further in accordance with a preferred embodiment of the present invention, the semiconductor elements include transistors formed on a silicon substrate.

Still further in accordance with a preferred embodiment of the present invention, the fusible links include a first plurality of connection links operative to provide a plurality of connections between individual semiconductor elements to define functional groupings thereof and a second plurality of connection links operative to provide a plurality of connections between functional groupings.

Additionally in accordance with a preferred embodiment of the present invention, the fusible links are arranged so as to be fusible by operation directly thereon via the aperture by fusing apparatus external thereto.

There is also provided in accordance with a further preferred embodiment of the present invention an integrated circuit device including a substrate, a collection of cells mounted on the substrate having input/output pins for operating the integrated circuit device, a plurality of fusible links connecting the cells into an inoperable circuit device, and an insulation layer disposed over the collection of cells and having discrete apertures overlying the fusible links, the plurality of fusible links being without electrical fusing connections capable of fusing by electrical current supplied through the input/output pins of the integrated circuit, the collection of cells being interconnected for converting the inoperable circuit device into an operable circuit device upon fusing of predetermined ones of the plurality of links.

Further in accordance with a preferred embodiment of the present invention, the integrated circuit includes a gate array.

In accordance with a further preferred embodiment of the present invention, there is a provided a method for production of integrated circuits including the steps of providing a collections of semiconductor elements and fusible links interconnecting the collection of semiconductor elements into an inoperably connected integrated circuit, forming an insulation layer over the collection of semiconductor elements and forming discrete apertures overlying the fusible links.

In accordance with yet a further preferred embodiment of the present invention there is provided a method for production of gate arrays including the steps of providing a collection of semiconductor elements and fusible links interconnecting the collection of semiconductor elements into an inoperably connected gate array device, forming an insulation layer over the collections of semiconductor elements and forming discrete apertures overlying the fusible links.

Further in accordance with a preferred embodiment of the present invention, the method also includes the step of converting the inoperable integrated circuit into a selected operable electronic function by fusing of predetermined ones of the fusible links.

Still further in accordance with a preferred embodiment of the present invention, the method also includes the step of converting the inoperable gate array device into a selected operable electronic function by fusing of predetermined ones of the fusible links.

Further in accordance with a preferred embodiment of the present invention, the method also includes the step of coating the fusible links exposed through the apertures with etch-resistant coating.

Further in accordance with a preferred embodiment of the present invention, the step of converting includes the step of directing laser radiation through the apertures on the predetermined ones of the fusible links.

Still further in accordance with a preferred embodiment of the present invention, the step of converting includes the step of chemically etching of the predetermined ones of the fusible links.

There is also provided in accordance with still a further preferred embodiment of the present invention a customized gate array device including a collection of semiconductor elements, fusible links interconnecting the collection of semiconductor elements into an inoperably connected gate array device, and an insulation layer disposed over the collection of semiconductor elements and having discrete apertures overlying the fusible links, the collection of semiconductor elements being interconnected and selected ones of the fusible links being fused, thereby converting the inoperable gate array device into a selected operable electronic function.

Further in accordance with a preferred embodiment of the present invention, the gate array device includes at least two metal layers and fusible links formed on each of the at least two metal layers.

Still further in accordance with a preferred embodiment of the present invention, the gate array device includes at least two metal layers and the fusible links including fusible links formed on each of the at least two metal layers.

Additionally in accordance with a preferred embodiment of the present invention, the integrated circuit device includes at least two metal layers and the fusible links including fusible links formed on each of the at least two metal layers.

Still further in accordance with a preferred embodiment of the present invention, the collection of semiconductor elements includes at least two metal layers and the fusible links include fusible links formed on each of the at least two metal layers.

There is also provided in accordance with a preferred embodiment of the present invention, an integrated circuit made by any of the processes described hereinabove.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

Figure 1A:
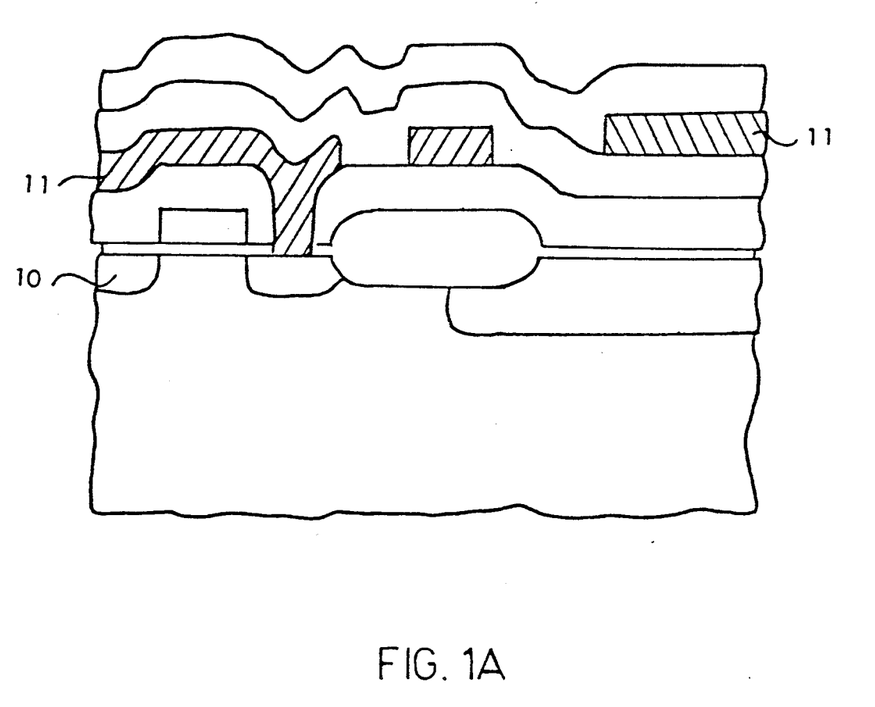
FIG. 1A is a cross-sectional illustration of one type of an integrated circuit of conventional design to which the invention may be applied.

Reference is now made to FIG. 1A which illustrates in cross-section a typical CMOS gate array circuit of the type to which the invention may be applied. The CMOS gate array is used as an example for the purposes of illustration herein. The invention is equally applicable to other types of gate arrays such as, for example, ECL and TTL and to the various designs of gate arrays of these types and others made by various manufacturers. The invention is also applicable to integrated circuits in general other than gate arrays.

The circuit illustrated in FIG. 1A includes an array 10 of semiconductor elements which may be interconnected by a suitable metal layer 11 to define the electrical function of the circuit. According to the present invention, fusible links are provided between the semiconductor elements in a manner which enables the functions to be selected by the user.

Figure 1B:
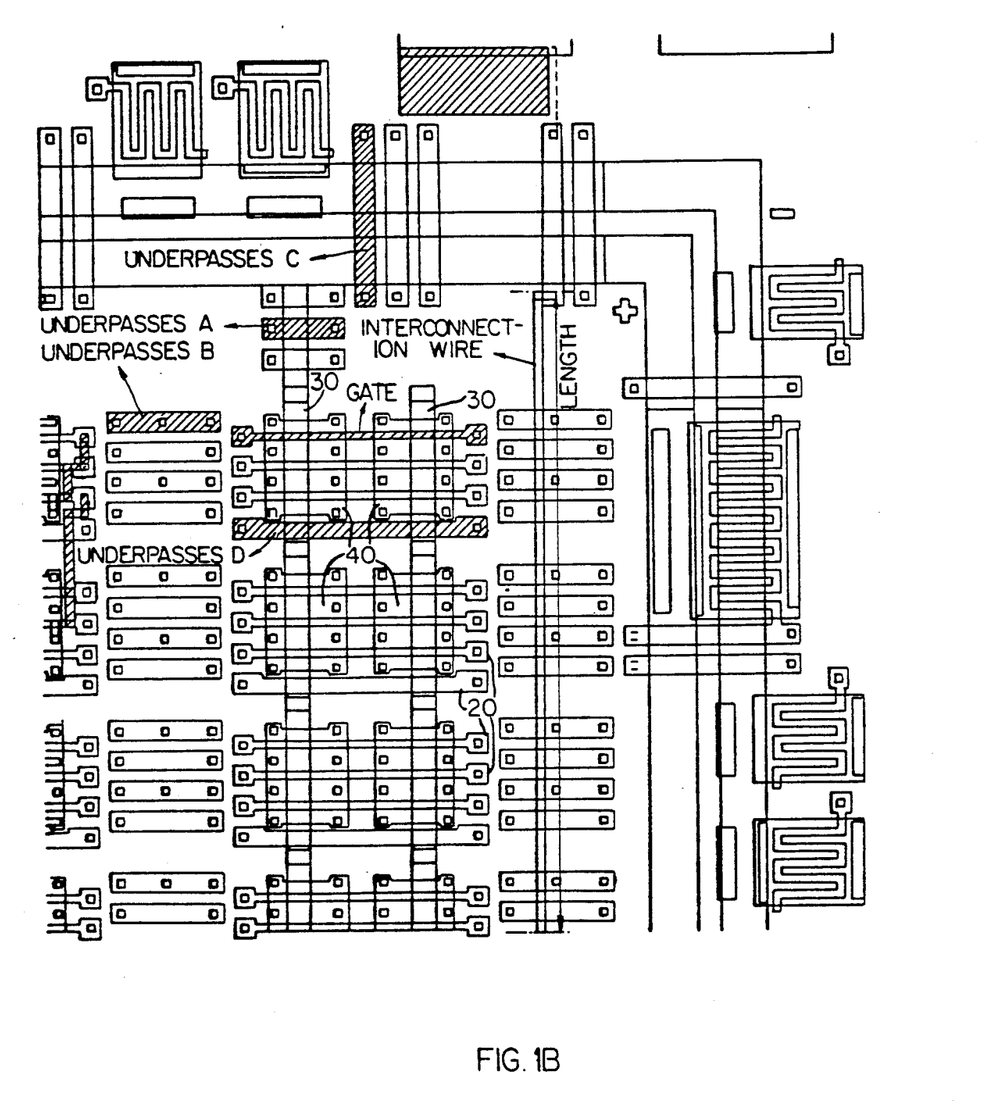
FIG. 1B is a more detailed illustration of the physical layout of a portion of the circuit of the type illustrated in FIG. 1A.

FIG. 1B illustrates a portion of a circuit of the type illustrated in FIG. 1A. The basic structure is as follows: A first plurality of gates 20 arranged on the integrated circuit is separated from a second plurality of power lines 30, here identified as VDD and VSS, arranged as part of the metal layer of the integrated circuit by the layout software and over the transistors in section 40 of layered semi-conductor material such as doped silicon. The interconnections between the various conductors define the electronic function provided by the integrated circuit.

More specifically each junction across the semi-conductor material defines a semiconductor element in its most basic form. A combination of these junctions may define a cell and a plurality of such combinations may define an electronic function equivalent to a plurality of cells.

The illustration of FIG. 1B does not illustrate the interconnections between the semiconductor elements. Those interconnections are provided in accordance with the present invention, as illustrated in FIG. 2.

Figure 2:
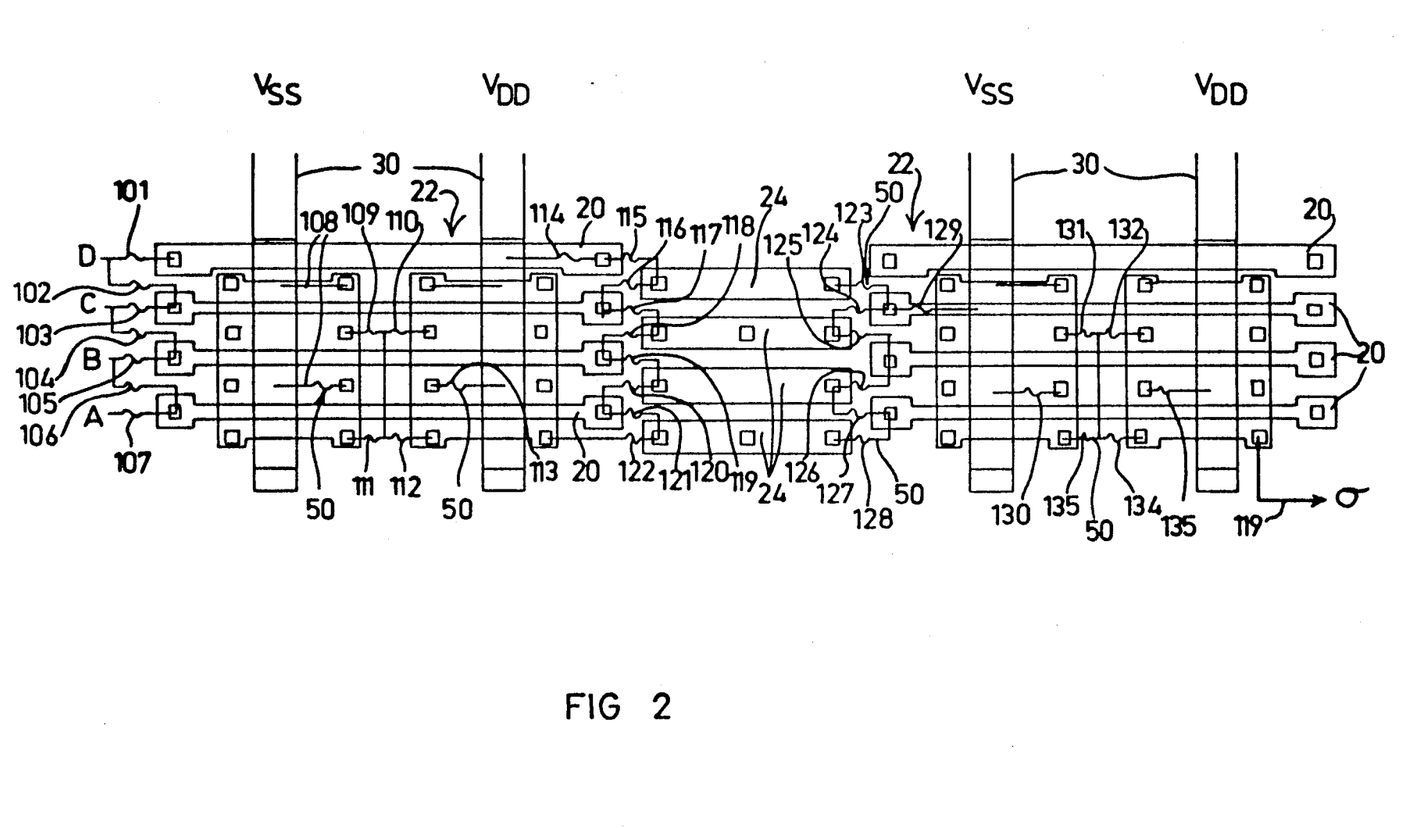
FIG. 2 is a detailed illustration of a portion of a layout shown in FIG. 1B, illustrating fusible interconnections between individual semiconductor elements and between functional groups of areas defining gates.

FIG. 2 illustrates a portion of the gate array of FIG. 1B onto which interconnections have been made in accordance with the present invention. As noted above, the interconnections are made by the metal interconnections layer formed, normally, as the one before the last layer during the fabrication of the integrated circuit. This, however, need not be the case.

Turning to FIG. 2, and adopting the reference numerals already used in connection with FIG. 1B, it is seen that gates 20 and groups 22 of gates 20 are interconnected directly or through underpasses 24, by means of a multiplicity of fusible links 50. Fusible links 50 also interconnect gates 20 with power lines 30. According to a preferred embodiment of the present invention, the fusible links 50 provide a plurality of alternative interconnections between the various gates and power lines, such that until some of the fusible links are fused, the gate array is not practically useful.

It is emphasized that the invention is not limited to any particular pattern of fusible link interconnections between conductors.

Further in accordance with a preferred embodiment of the present invention, the fusible links are not arranged such that they can be fused by means of providing electrical current through the external connections of the integrated circuit. No such electrical connections are provided for that purpose. Thus fusible links 50 are adapted for fusing by application of energy locally to the links themselves or to the vicinity thereof. Obviating the need for electrical connections for fusing greatly simplifies the design and increases the circuit carrying capacity of integrated circuits.

The fusible links 50 illustrated in FIG. 2 have a number of different functions. They may serve as "substructure" links which join semiconductor elements so as to define functions of individual logic gates. Alternatively or additionally they may serve as "interconnection" links, which serve to join individual cells in a predetermined order to provide a desired multiple cell function. FIG. 2 shows a circuit having inputs A, B, C, and D and an output O.

The effect of fusing selected fusible links will now be considered with reference to FIGS. 3A–3C and 4A–4C. To aid in this consideration, the individual fusible links illustrated in FIG. 2 will be identified by numbers beginning with 101.

Figure 3A:
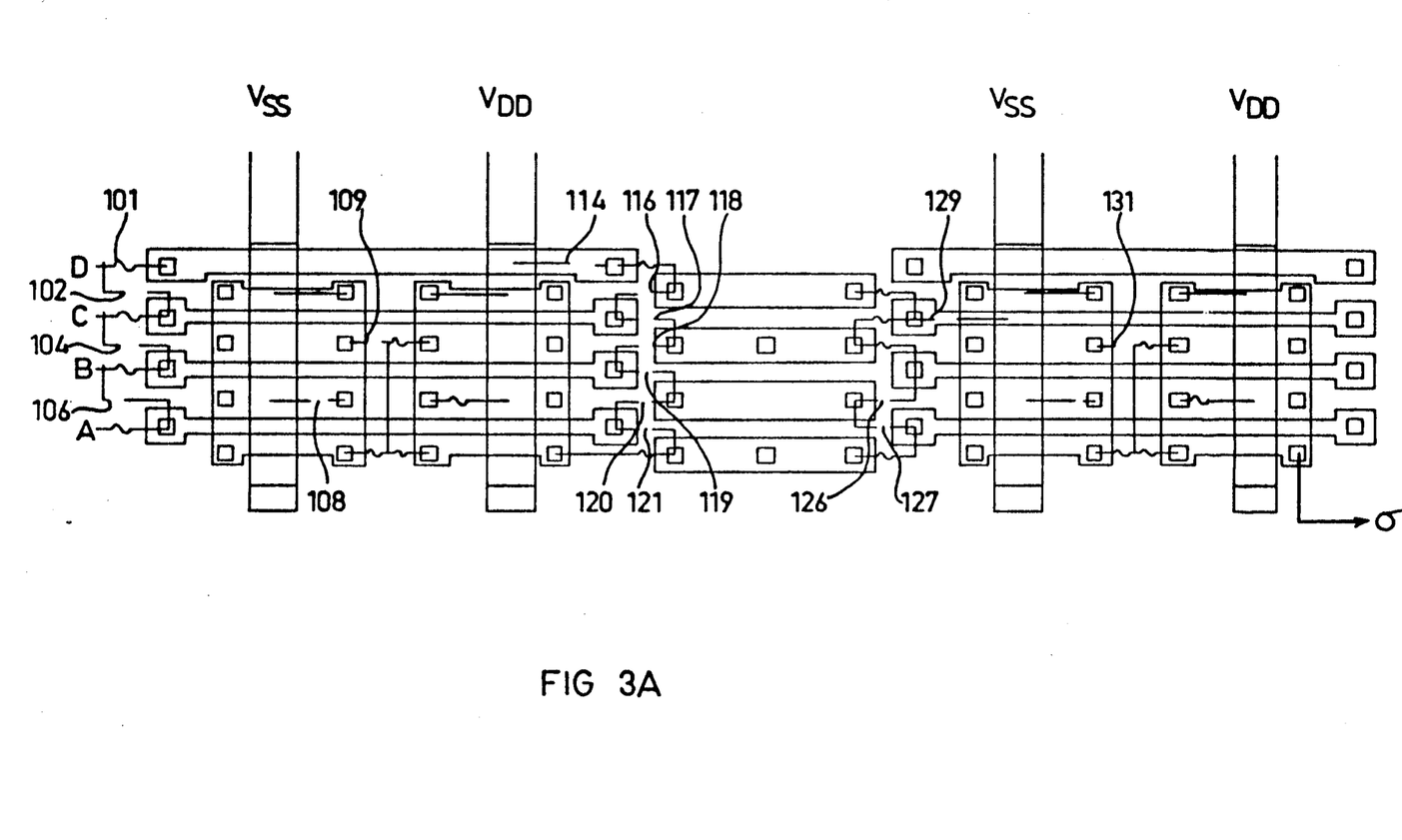
FIGS. 3A, 3B and 3C are illustrations of the part of the integrated circuit shown in FIG. 2, wherein selected ones of the fusible interconnections have been fused, in three different configurations.

In FIG. 3A, the following links are fused: 102, 104, 106, 108, 109, 114, 116, 117, 118, 119, 120, 121, 126, 127, 129 and 131. The remaining links remain intact.

Figure 4A:
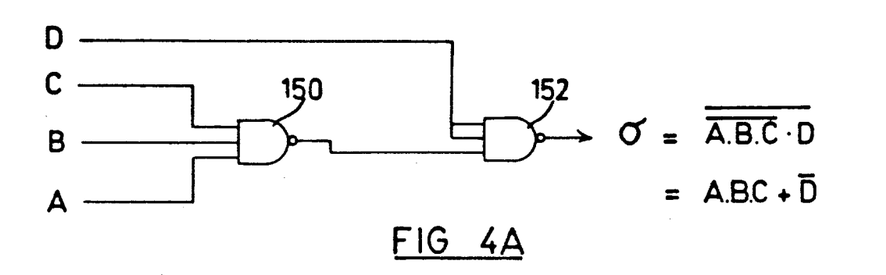
FIGS. 4A, 4B, and 4C are illustrations of the electrical equivalent circuits to the circuits of FIGS. 3A, 3B and 3C respectively.

FIG. 4A illustrates the resulting equivalent logic circuit which includes a NAND gate 150 operating on inputs A, B and C and a second NAND gate 152 operating on the output from NAND gate 150 as well as input D. The output O from NAND gate 152 is the logic function: A B C+$\overline{D}$.

Figure 3B:
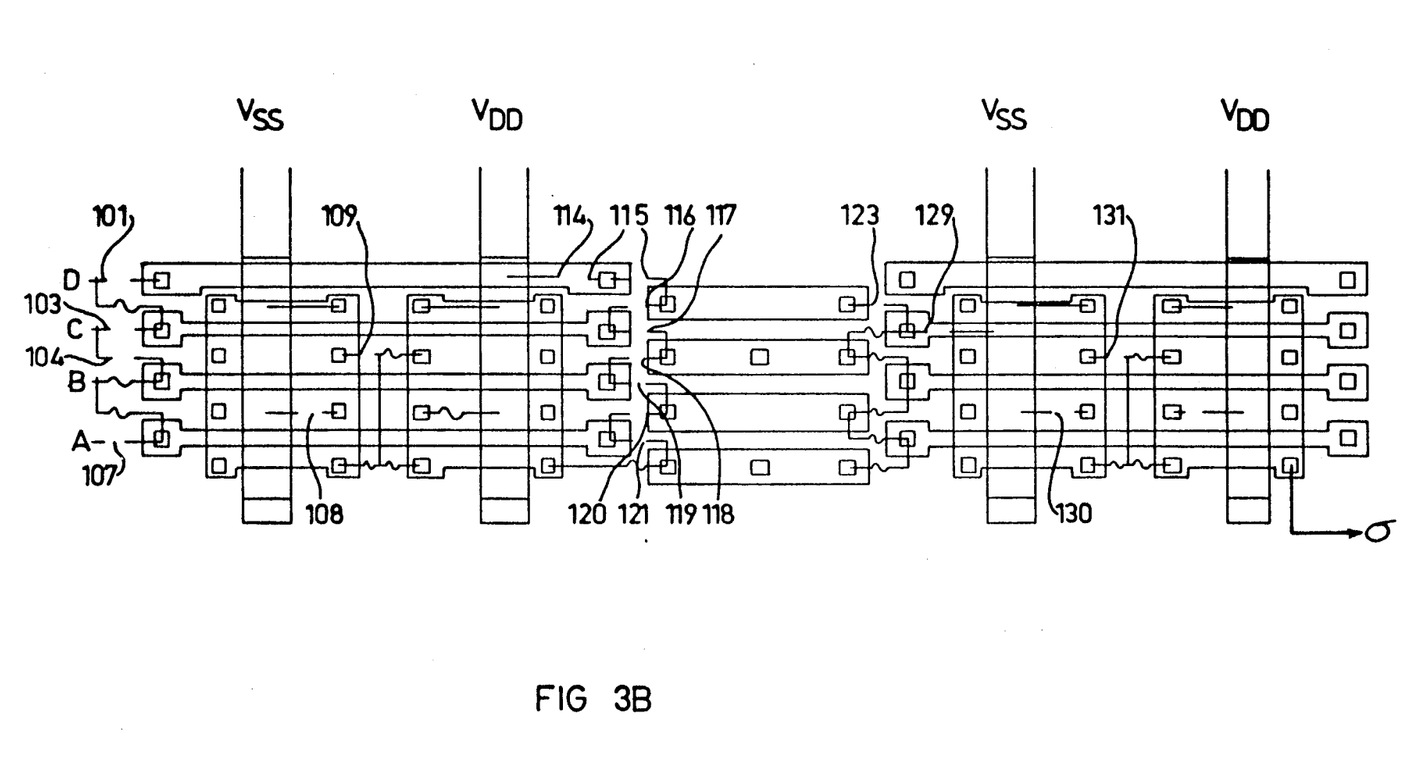

In FIG. 3B, the following links are fused: 101, 103, 104, 107, 108, 109, 114, 115, 116, 117, 118, 119, 120, 121, 123, 129, 130 and 131. The remaining links remain intact.

Figure 4B:
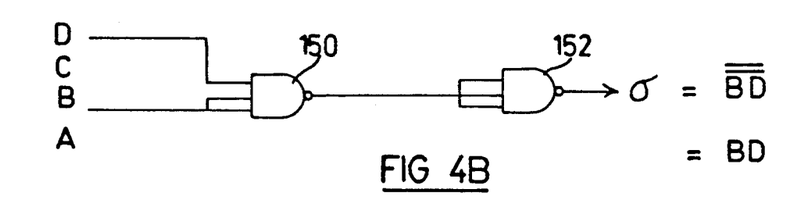

FIG. 4B illustrates the resulting equivalent logic circuit which includes a NAND gate 150 operating on inputs B and D and a second NAND gate 152 operating on the output from NAND gate 150. The output O from NAND gate 152 is the logic function: B D.

Figure 3C:
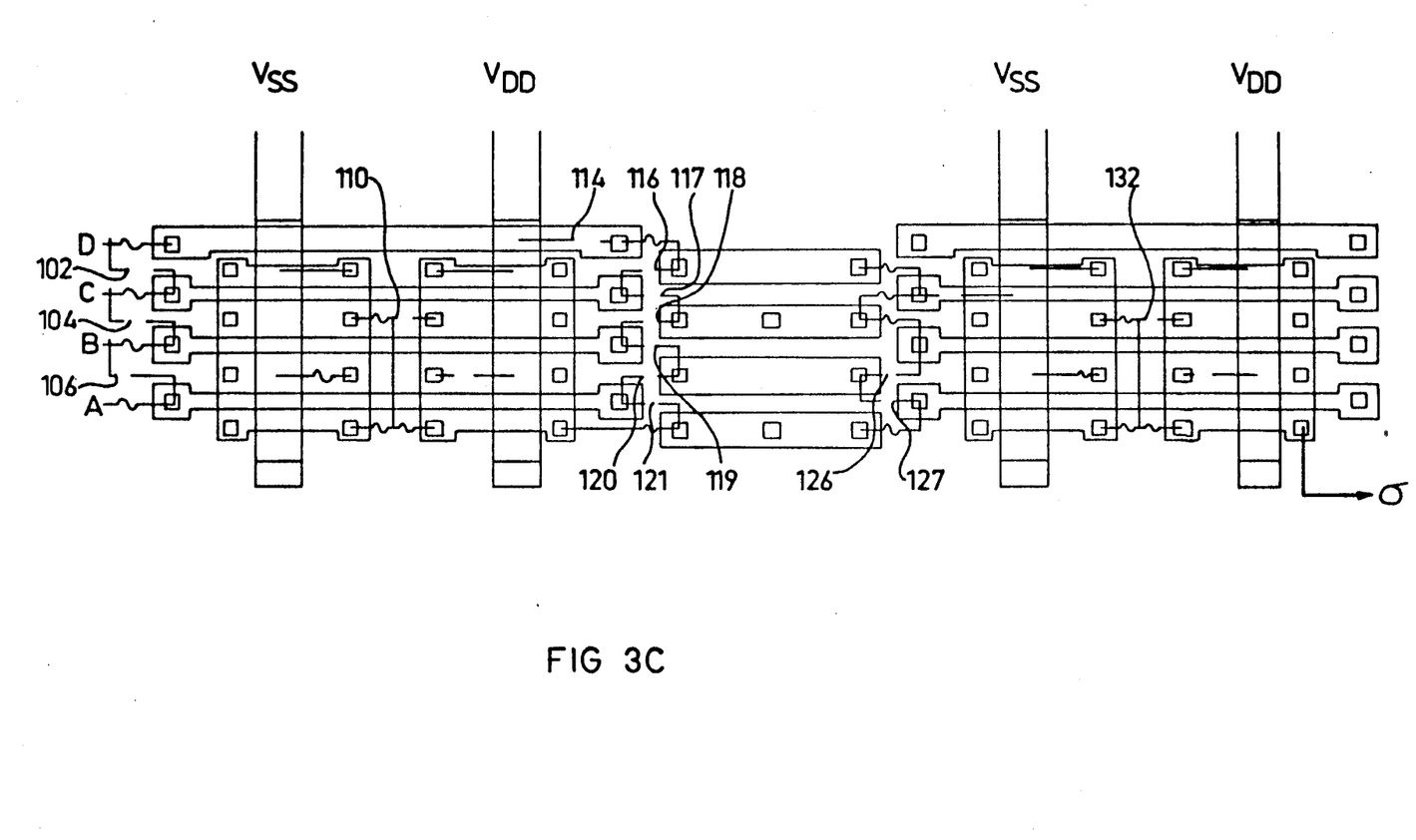

In FIG. 3C, the following links are fused: 102, 104, 106, 110, 114, 116, 117, 118, 119, 120, 121, 126, 127 and 132. The remaining links remain intact.

Figure 4C:
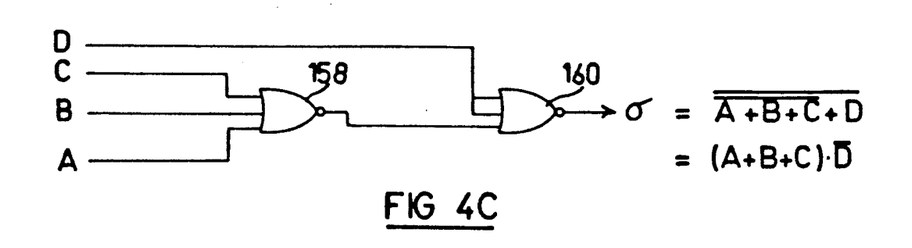

FIG. 4C illustrates the resulting equivalent logic circuit which includes a NOR gate 158 operating on inputs A, B and C and a second NOR gate 160 operating on the output from NOR gate 158 and input D. The output O from NOR gate 160 is the logic function: (A+B+C) $\overline{D}$.

From the above examples it may be appreciated that the following fusible links may be considered as "substructure links": 108, 109, 110, 111, 112, 113, 130, 131, 132, 133 and 134.

Likewise, the following fusible links may be considered as "interconnection" links: 101, 102, 103, 104, 105, 106, 107, 114, 115, 116, 117, 118, 119, 120, 121, 122, 123, 124, 125, 126, 127, 128 and 129.

It is possible, of course, for fusible links to have both functions.

The process of integrated circuit fabrication in accordance with the present invention is summarized as follows:

The steps include providing a conventional gate array or any other integrated circuit without an interconnection layer and providing interconnections between the various elements in the gate array including multiple fusible connections. The above steps are normally carried out by the manufacturer of the integrated circuit in accordance with the present invention.

The integrated circuit is then supplied to the customer, such as a manufacturer of electronic equipment. In the form supplied, the integrated circuit is normally not usable for any usual commercial function.

The customer then fuses selected fusible links on the individual integrated circuits to define a particular desired electronic function. According to a preferred embodiment of the invention, the fusing step is carried out by operation directly on the fusible link by a source of fusing energy. Once the appropriate links have been fused, as aforesaid, and the integrated circuit has been tested appropriately, it is ready for incorporation into a prototype electronic system.

Figure 5:
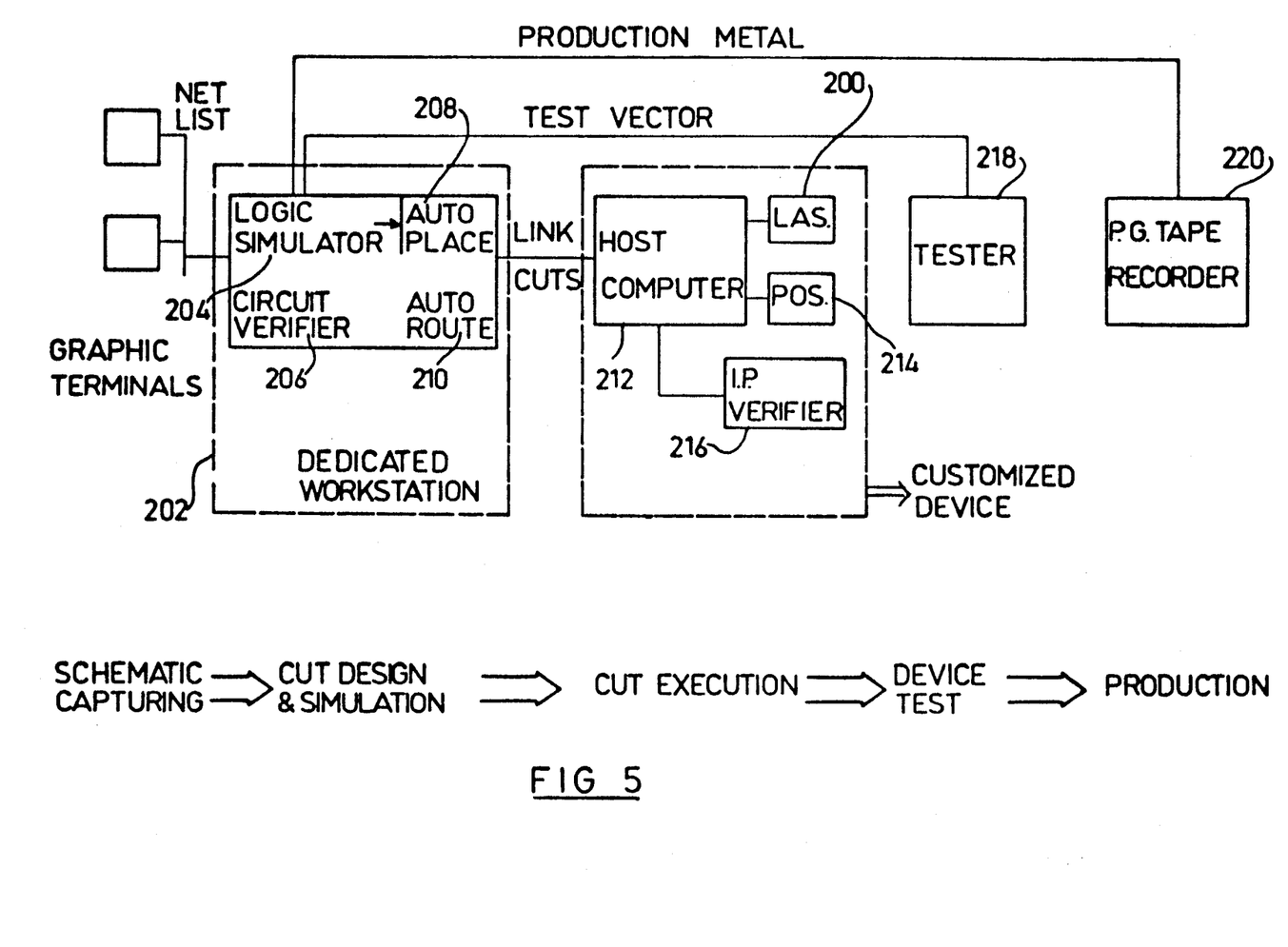
FIG. 5 is a block diagram illustration of apparatus for use in customizing integrated circuits.

Apparatus for carrying out the fusing step is illustrated in block diagram form in FIG. 5. The apparatus is based on a conventional laser cutter 200 such as that manufactured by Florod Corporation of Hawthorne, Calif., U.S.A..

A dedicated workstation 202 is preferably but not necessarily provided for input of desired design and operation data and may include logic simulator apparatus 204, circuit verification apparatus 206, as well as automatic placement and routing apparatus 208 and 210 respectively for determining the cutting pattern design.

The workstation 202 communicates with various input and output elements, such as a graphics terminal and tape or disk storage apparatus, not shown and also communicates with a host computer 212, such as a PDP-11/23. The host computer receives the cutting pattern design from the workstation and provides control commands to the laser cutter 200 and positioning apparatus 214. A position verifier circuit 216 provides confirmation of correct positioning and cutting. Additional testing and cut program recording apparatus 218 and 220 is also provided. The information recorded in apparatus 220 may be used for direct mass production of integrated circuits including a metal layer having the desired interconnection links.

It will be appreciated by persons skilled in the art that the invention can be carried out using the conventional Florod laser cutter or equivalent available apparatus together with conventional available computer technology without the special purpose apparatus described in FIG. 5.

Figure 6:
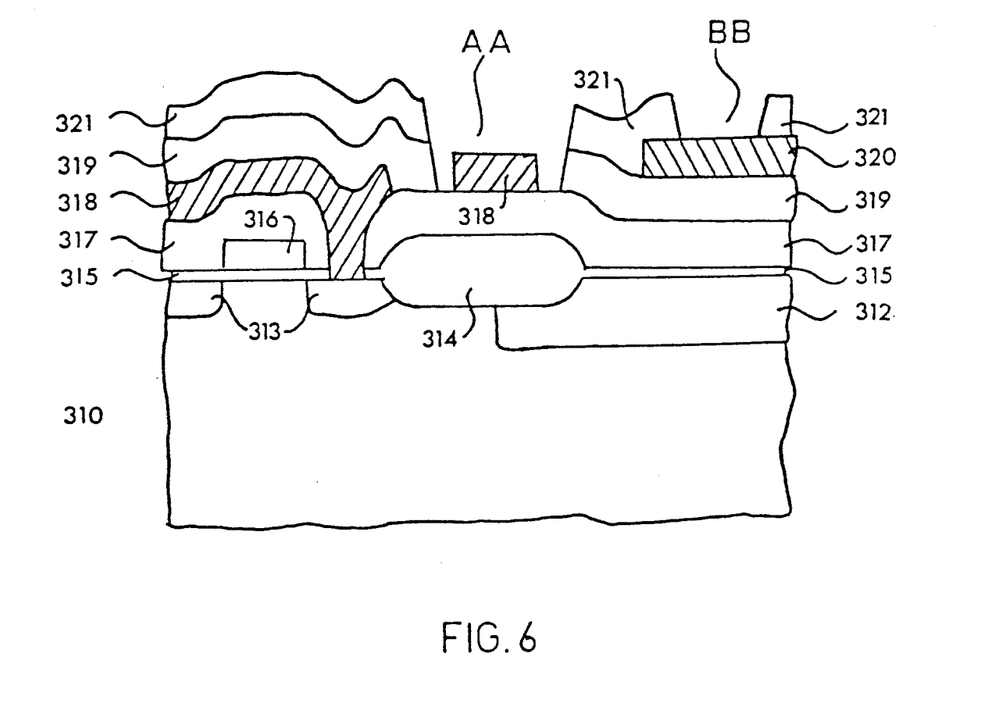
FIG. 6 is a cross-sectional illustration of a typical integrated circuit having apertures formed in insulating layers thereof.
Figure 7:
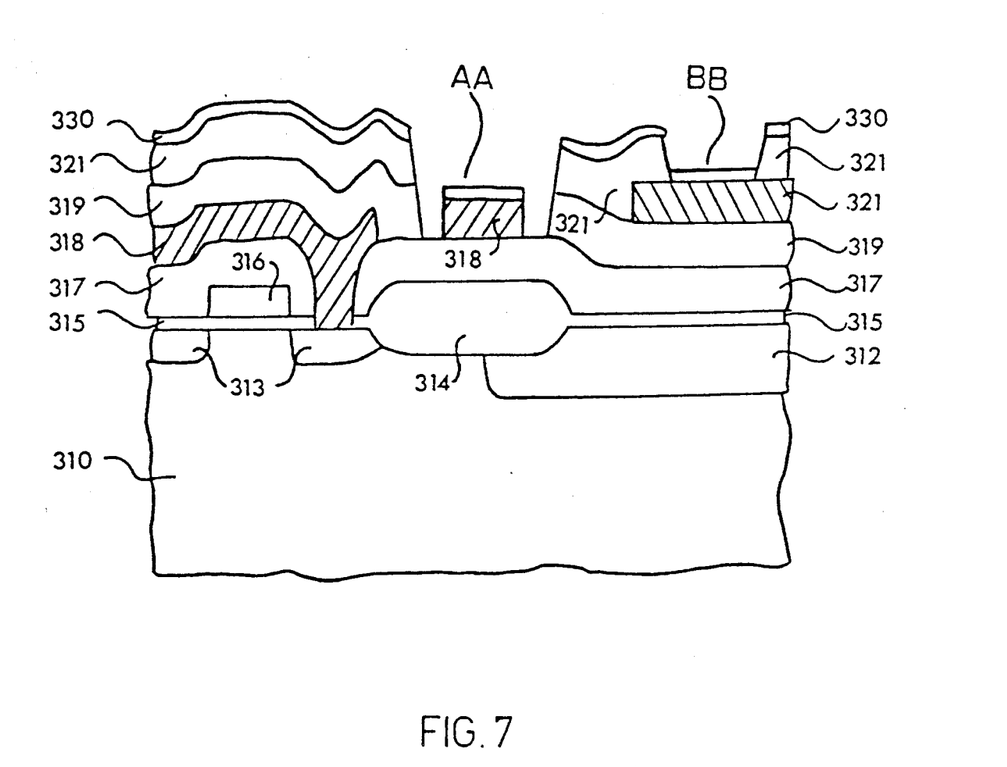
FIG. 7 is a cross-sectional illustration of a typical integrated circuit having apertures formed in insulating layers thereof and coated with an anti-reflective coating.
Figure 8:
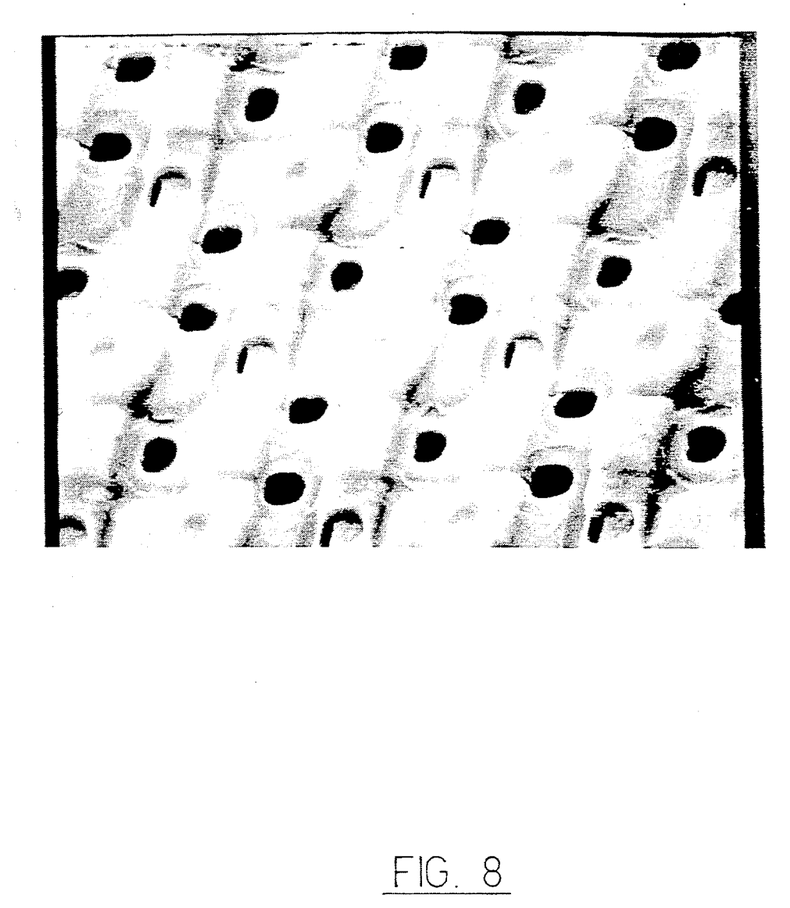
FIG. 8 is a scanning electromicrograph of the surface of a typical integrated circuit formed with apertures in the insulating layer overlying the metal layer thereof.

Reference is now made to FIGS. 6-8, which illustrate a technique for providing the abovementioned fusible links in the manufacturing of a prototype integrated circuit.

FIG. 6 illustrates in cross-section (not to scale) a typical integrated circuit comprising a substrate layer 310, typically formed of silicon or gallium arsenide. A plurality of diffusion layers 312 and 313 are disposed over substrate layer 310 and are covered by insulative layers 314 and 315, such as layers formed of silicon oxide or silicon nitride. A conducting layer, such as a polysilicon gate 316, lies over layers 314 and 315. Gate 316, layer 315 and layer 314 are in turn covered by a further insulating layer 317, such as a layer formed of silicon oxide, silicon nitride or polyimide. Holes are etched in layer 317 to provide electrical contact between layers 310, 312, 313 and 316 at pre-determined locations.

A conducting metal layer 318, such as a layer formed of aluminum, copper, gold, titanium, molybdenum, nickel, chrome, tungsten, combinations of the above or combinations of the above with silicon is located over layer 317 and in local communication with a portion of diffusion layer 313. A further insulating layer 319, such as a layer formed of phosphorous doped or undoped silicon oxide, silicon nitride or polyimide, overlies layers 317 and 318. An additional conducting metal layer 320 may be locally deposited over insulative layer 319. An insulative protective layer 321 overlies layers 319 and 320.

As can be seen in FIG. 6, the insulative layers 319 and 321 have been formed with discrete apertures, indicated by reference letters AA and BB, so as to expose metal layers 318 and 320 respectively, for later fusing. The apertures in the insulative layer may be formed by first coating the entire area of the integrated circuit with the insulative coating and then using a mask to define the locations of the multiplicity of discrete apertures formed by standard etching techniques.

According to an alternative embodiment of the present invention, the configuration shown in FIG. 6 may be covered by an anti-reflective coating 330, such as amorphous silicon titanium oxide or zinc sulfide, which is shown (not to scale) in FIG. 7.

It will be appreciated that, as described hereinabove, the integrated circuit blank of FIGS. 6 and 7 is subject to selective fusing of portions of the exposed metal, in order to define the characteristics and functions of the integrated circuit. This selective fusing may be advantageously carried out by laser irradiation, as illustrated hereinabove with reference to FIG. 5, or alternatively by any other suitable technique, such as chemical etching, using conventional etchants, and conventional photolithography masking techniques.

FIG. 8 is a photograph made by a scanning electron microscope, at a magnification of 2300×, illustrating the configuration shown in FIG. 6.

It will be appreciated by persons skilled in the art that the present invention is not limited by what has been particularly shown and described hereinabove. Rather the scope of the present invention is defined only by the claims which follow:

We claim:

1. A gate array device comprising:
   a collection of semiconductor elements; fusible links interconnecting the collection of semiconductor elements into an inoperably connected gate array device; and
   an insulation layer disposed over said collection of semiconductor elements and having discrete apertures overlying said fusible links,
   said collection of semiconductor elements being interconnected for converting the inoperable gate array device into a selected operable electronic function upon the fusing of predetermined ones of the fusible links.

2. A gate array device according to claim 1 and wherein said semiconductor elements comprise transistors formed on a silicon substrate.

3. A gate array device according to claim 1 and wherein said fusible links comprise a first plurality of connection links operative to provide a plurality of connections between individual semiconductor elements to define functional groupings thereof and a second plurality of connection links operative to provide a plurality of connections between functional groupings.

4. A gate array device according to claim 2 and wherein said gate array device includes a least two metal layers and fusible links formed on each of said at least two metal layers.

5. A gate array device according to claim 3 and wherein said gate array device includes at least two metal layers and said fusible links including fusible links formed on each of said at least two metal layers.

6. An integrated circuit device comprising:
a substrate;
a collection of cells mounted on the substrate having input/output pins for operating the integrated circuit device;
a plurality of fusible links connecting the cells into an inoperable circuit device; and
an insulation layer disposed over said collection of cells and having discrete apertures overlying said fusible links,
said plurality of fusible links being without electrical fusing connections capable of fusing by electrical current supplied through the input/output pins of the integrated circuit, said collection of cells being interconnected for converting the inoperable circuit device into an operable circuit device upon fusing of predetermined ones of said plurality of links.

7. An integrated circuit according to claim 6 and wherein said integrated circuit comprises a gate array.

8. An integrated circuit device according to claim 5 and wherein said integrated circuit device includes at least two metal layers and said fusible links including fusible links formed on each of said at least two metal layers.

9. A integrated circuit device according to claim 6 and wherein said gate array device includes at least two metal layers and said fusible links including fusible links formed in each of said at least two metal layers.

10. A customized gate array device comprising:
a collection of semiconductor elements;
fusible links interconnecting the collection of semiconductor elements into an inoperably connected gate array device; and
an insulation layer disposed over said collection of semiconductor elements and having discrete apertures overlying said fusible links,
said collection of semiconductor elements being interconnected and selected ones of said fusible links being fused, thereby converting the inoperable gate array device into a selected operable electronic function.

11. An integrated circuit device according to claim 27 and wherein said gate array device includes at least two metal layers and said fusible links including fusible links formed on each of said at least two metal layers.

* * * * *